US006489177B1

(12) United States Patent
Inomoto

(10) Patent No.: US 6,489,177 B1
(45) Date of Patent: Dec. 3, 2002

(54) MODULATOR-INTEGRATED SEMICONDUCTOR LASER AND METHOD OF FABRICATING THE SAME

(75) Inventor: Yasumasa Inomoto, Tokyo (JP)

(73) Assignee: NEC Corporation, Tokyo (JP)

( * ) Notice: Subject to any disclaimer, the term of this patent is extended or adjusted under 35 U.S.C. 154(b) by 41 days.

(21) Appl. No.: 09/627,311

(22) Filed: Jul. 27, 2000

(30) Foreign Application Priority Data

Jul. 28, 1999 (JP) .......................................... 11-213580

(51) Int. Cl.[7] .......................... H01L 21/00; H01L 27/15; H01L 219/74
(52) U.S. Cl. ............................ 438/31; 438/29; 438/32; 438/42; 257/79; 257/84; 257/116
(58) Field of Search ............................. 257/12, 14, 79, 257/84, 116, 117, 118; 438/29, 31, 32, 41

(56) References Cited

U.S. PATENT DOCUMENTS

| 5,019,519 A | | 5/1991 | Tanaka et al. | |
|---|---|---|---|---|
| 5,250,462 A | * | 10/1993 | Sasaki et al. | 438/24 |
| 5,436,195 A | * | 7/1995 | Kimura et al. | 438/24 |
| 5,459,747 A | * | 10/1995 | Takiguchi et al. | 372/50 |
| 5,481,559 A | | 1/1996 | Kawamura | 372/50 |
| 5,728,215 A | * | 3/1998 | Itagaki et al. | 117/104 |
| 5,811,838 A | * | 9/1998 | Inomoto | 257/80 |
| 5,889,913 A | * | 3/1999 | Tohyama et al. | 385/131 |
| 5,912,475 A | * | 6/1999 | Itagaki et al. | 257/94 |
| 5,918,109 A | * | 6/1999 | Koui | 438/31 |
| 6,204,078 B1 | * | 3/2001 | Inomoto | 438/22 |
| 6,222,867 B1 | * | 4/2001 | Inomoto et al. | 372/50 |

FOREIGN PATENT DOCUMENTS

| EP | 0 437 836 | 7/1991 |
|---|---|---|
| EP | 0 680 119 | 11/1995 |

OTHER PUBLICATIONS

Ramdane et al., "Monolithic Integration of Multiple–Quantum–Well Lasers and Modulators for High–Speed Transmission", IEEE Journal of Selected Topics in Quantum Electronics, vol. 2, No. 2, pp. 326–335, Jun. 1996.
Electronic Letters 28 (Jan. 16, 1992); No. 2, Stevenage, Herts., GB, pp. 153–154.

* cited by examiner

Primary Examiner—Matthew Smith
Assistant Examiner—Lex H. Malsawma
(74) Attorney, Agent, or Firm—Foley & Lardner

(57) ABSTRACT

A semiconductor laser is fabricated on a substrate having a laser section and a modulator section by forming a light waveguide having an active layer that extends across the laser section and the modulator section from a high reflectivity end portion to a low reflectivity end portion. The light waveguide is enclosed by an embedding structure in which first and second high resistance regions are produced on the opposite sides of the light waveguide for confining electrons between the high resistance regions. On the embedding structure are first and second contact regions corresponding respectively to the laser section and the modulator section. Portions of the substrate other an the first and second elongated contact regions are covered with an insulating layer. First and second electrodes are formed on the insulating layer for establishing ohmic contact with the first and second elongated contact regions, respectively.

14 Claims, 11 Drawing Sheets

MODULATOR-INTEGRATED SEMICONDUCTOR LASER AND METHOD OF FABRICATING THE SAME

BACKGROUND OF THE INVENTION

1. Field of the Invention

The present invention relates generally to semiconductor or lasers and more specifically to a modulator-integrated semiconductor laser.

2. Description of the Related Art

For optical communications systems, semiconductor lasers essential elements and their ability to modulate the laser beam with information signals is an important factor to achieve high speed transmission. One approach to achieving this goal is to reduce the device capacitance. In conventional semiconductor lasers, a light waveguide including the active layer of the laser is buried in an InP embedding layer and a contact layer such as InGaAs or InGaAsP is formed on the embedding layer. Through the contact layer, the embedding layer are selectively implanted with proton to create high resistance regions on the opposite side portions of the active layer, As a result of the carrier confinement effect of the high resistance regions, injection current is efficiently utilized by the active layer. An electrode is then formed on the contact layer. Although the contact layer is formed of the material known to exhibit inability to become highly resistive when subjected to a beam of protons, the electrode that extends over the full area of the device contributes to an increase in the device capacitance, which prevents the laser from operating at a speed of 10 Gb/s or higher.

Another approach to reducing device capacitance is to employ a pad electrode structure. However, the InP embedding layer is less of the ability to become highly resistive than is the InGaAs or IGaAsP contact layer. Thus, parasitic capacitances may exist between the proton implanted high resistance regions and the electrode.

SUMMARY OF THE INVENTION

It is therefore an object of the present invention to provide a semiconductor laser having a reduced capacitance, and a method of fabricating the laser for high speed operation.

According to a first aspect of the present invention, there is provided a semiconductor laser comprising a semiconductor substrate having a laser section and a modulator section, and a light waveguide having an active layer on the substrate and extending across the laser section and the modulator section from a high reflectivity end portion to a low reflectivity end portion. An embedding structure encloses the light waveguide. The embedding structure has a pair of high resistance regions one on each side of the light waveguide for confining electrons between the high resistance regions. First and second elongated contact regions are formed on the embedding structure corresponding respectively to the laser section and the modulator section. An insulating layer is provided for covering portions other than the first and second elongated contact regions. First and second electrodes are formed on the insulating layer for establishing ohmic contact with the first and second elongated contact regions, respectively.

According to a second aspect, the present invention provides a method of fabricating a seniconductor laser comprising the steps of (a) forming a light waveguide having an active layer on a semiconductor substrate having a laser section and a modulator section, the light waveguide extending across the laser section and the modulator section from a high reflectivity end portion to a low reflectivity end portion, (b) forming an embedding structure for enclosing the light waveguide, (c) forming first and second elongated contact regions on the embedding structure corresponding respectively to the laser section and the modulator section and producing first and second high resistance regions in the embedding structure on opposite sides of the light waveguide so that electrons are confined between the first and second high resistance regions, (d) forming an insulating layer for covering portions of the semiconductor laser other than the first and second elongated contact regions, and (e) forming first and second electrodes on the insulating layer for establishing ohmic contact with the first and second elongated contact regions, respectively.

BRIEF DESCRIPTION OF THE DRAWINGS

The present invention will be described in further detail with reference to the accompanying drawings, in which:

FIGS. 1A to 8A are top plan views of a modulator-integrated semiconductor laser of successive stages of a fabrication process according to a first embodiment of the present invention;

FIGS. 1B to 8B are end views of the modulator-integrated semiconductor laser corresponding to FIGS. 1A to 8A, respectively;

FIGS. 9A to 11A are top plan views of a modulator-integrated semiconductor laser of successive stages of a fabrication process according to a second embodiment of the present invention, and FIGS. 9B to 11B are end views of the modulator-integrated semiconductor laser corresponding to FIGS. 9A to 11A, respectively.

DETAILED DESCRIPTION

Referring now to FIGS. 1A, 1B to 8A, 8B, successive stages of a process of fabricating a modulator-integrated DFB (distributed feedback) semiconductor laser of a first embodiment of this invention are illustrated. In the present invention, a quaternary semiconductor such as InGaAsP is used as an active layer of the modulator-integrated semiconductor laser. In a practical aspect, an array of such laser devices are defined on a semiconductor wafer, For purposes of the disclosure, only one laser device is illustrated.

Figure 1A:
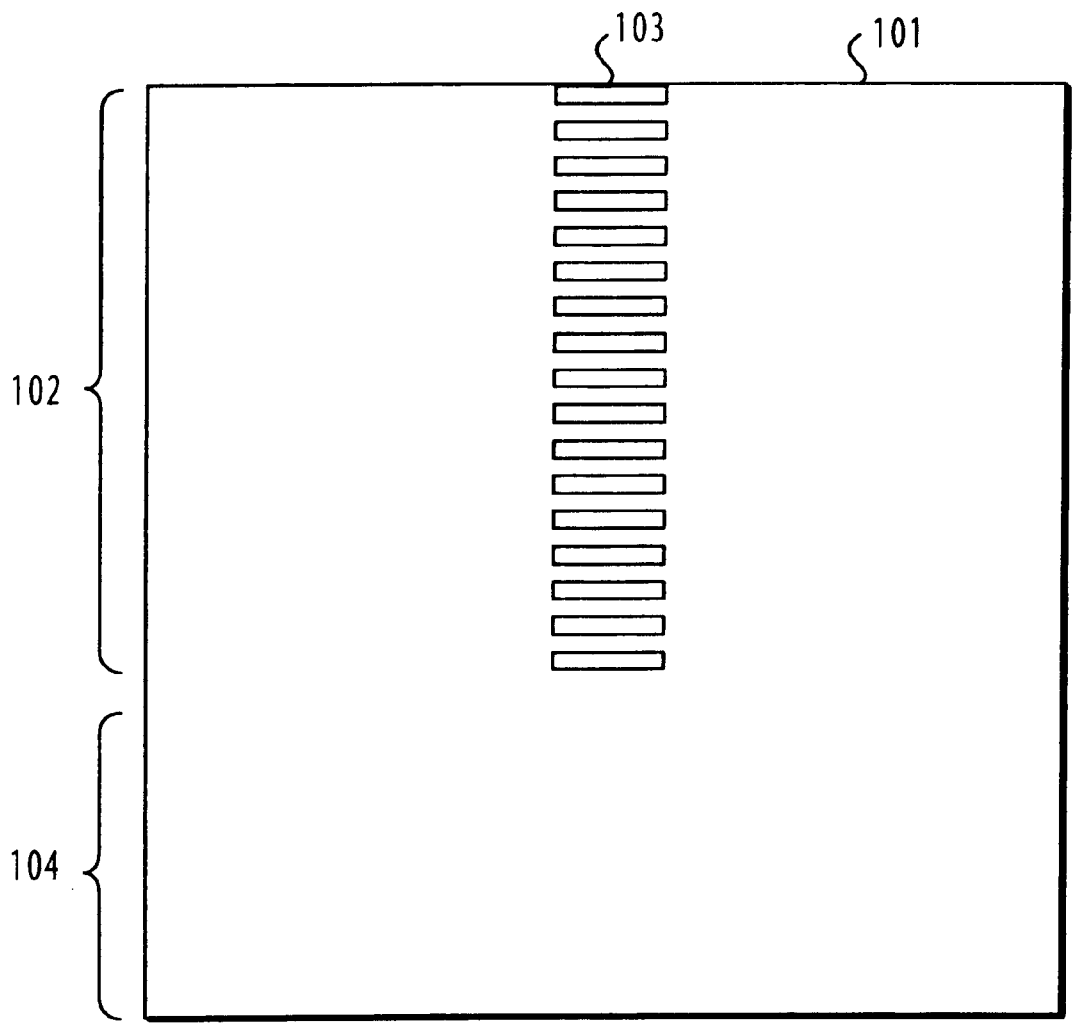
Figure 1B:
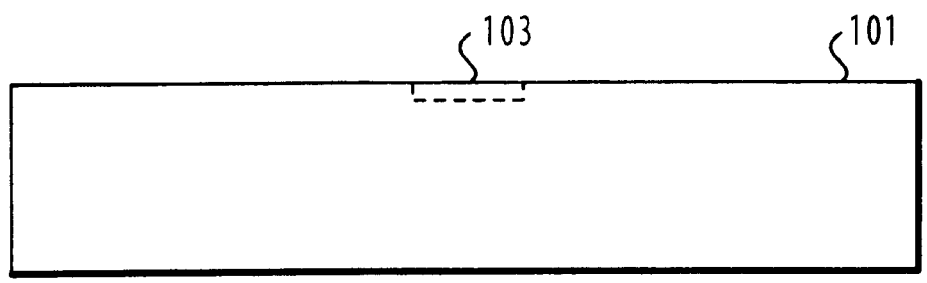

As shown in FIGS. 1A and 1B, an n-type InP semiconductor substrate 101 is illustrated having a crystal plane (100) as a principle surface of the substrate. The n-InP substrate has a laser section 102 and a modulator section 104. First, the crystal plane (100) is irradiated with an electron beam in the direction <011> of the substrate to form within a 400 $\mu$m×10 $\mu$m rectangular area a resist pattern at intervals of 241.7 nm in the laser section 102. A diffraction grating 1.03 is then formed in the rectangular area by subjecting the device to an appropriate etching solution.

Figure 2A:
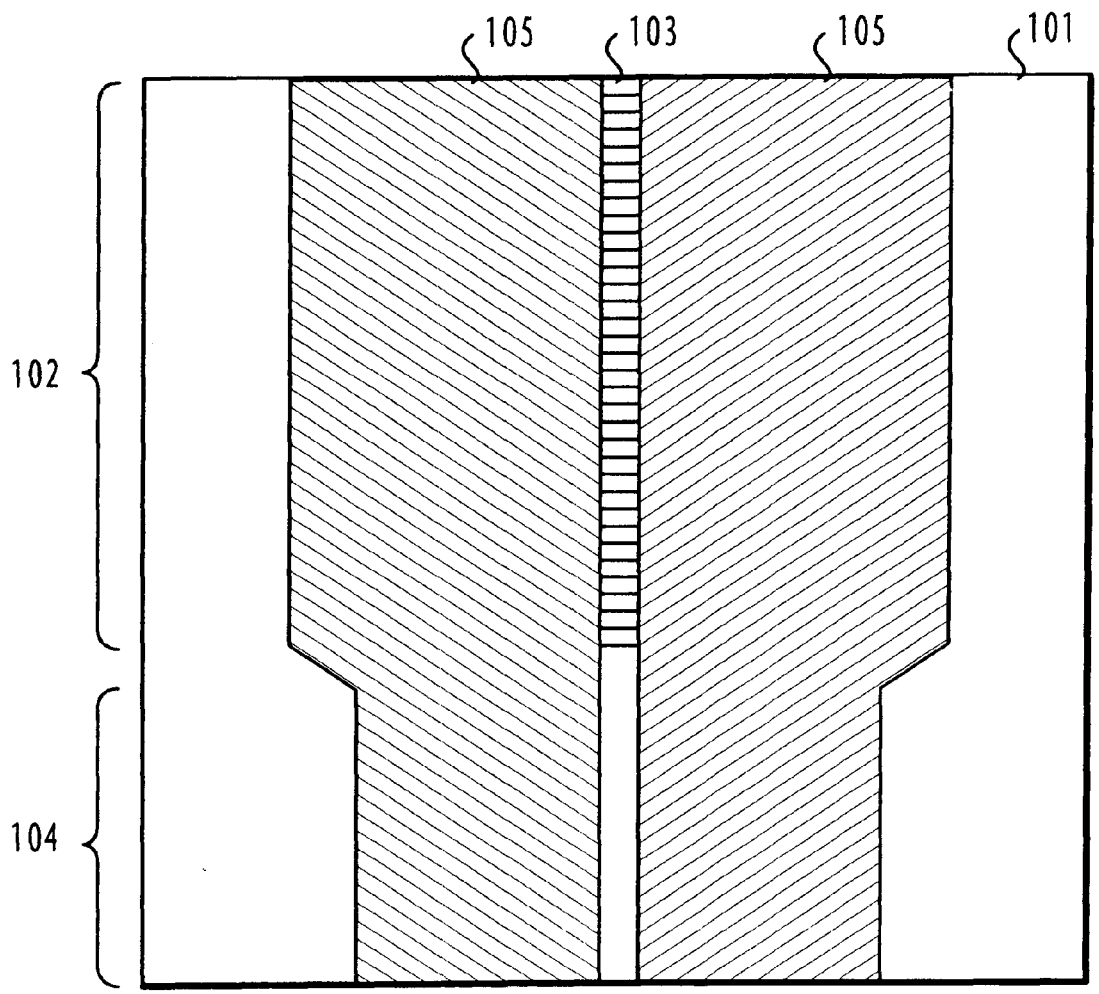
Figure 2B:
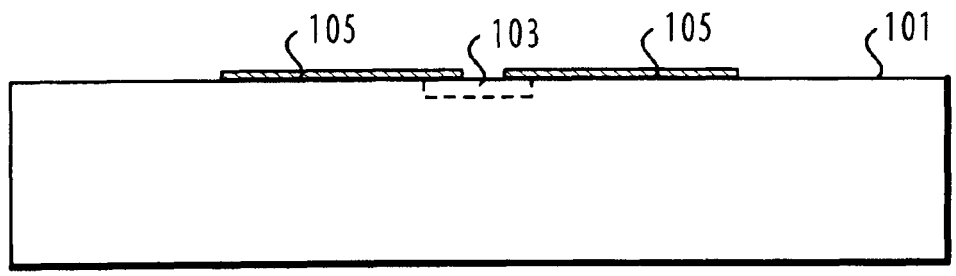

A pair of masking films 105 of silicon dioxide is formed across the whole length of the device so that the side portions of diffraction grating 103 and the extensions of such side portions are shielded from penetrating active molecules used in subsequent selective-area epitaxial growth processes. At the interface between the laser section 102 and the modulator section 104, the surface of each masking film 105 is tapered so that its width in the modulator section 104 is narrower than it is in the laser section 102, as shown in FIGS. 2A and 2B. More specifically, the masking films are formed by using the thermal CVD (chemical vapor deposition) method for depositing a 100-nm thick silicon dioxide layer, Photolithography and wet etching processes are then used to pattern the silicon dioxide film into a pair of stripes with a spacing of 1.5 $\mu$m therebetween in the crystal direction <011>, and with a width of 18 $\mu$m and a length of 400 $\mu$m in the laser section 102 and a width of 5 $\mu$m and a length of 200 $\mu$m in the modulator section 104.

Figure 3A:
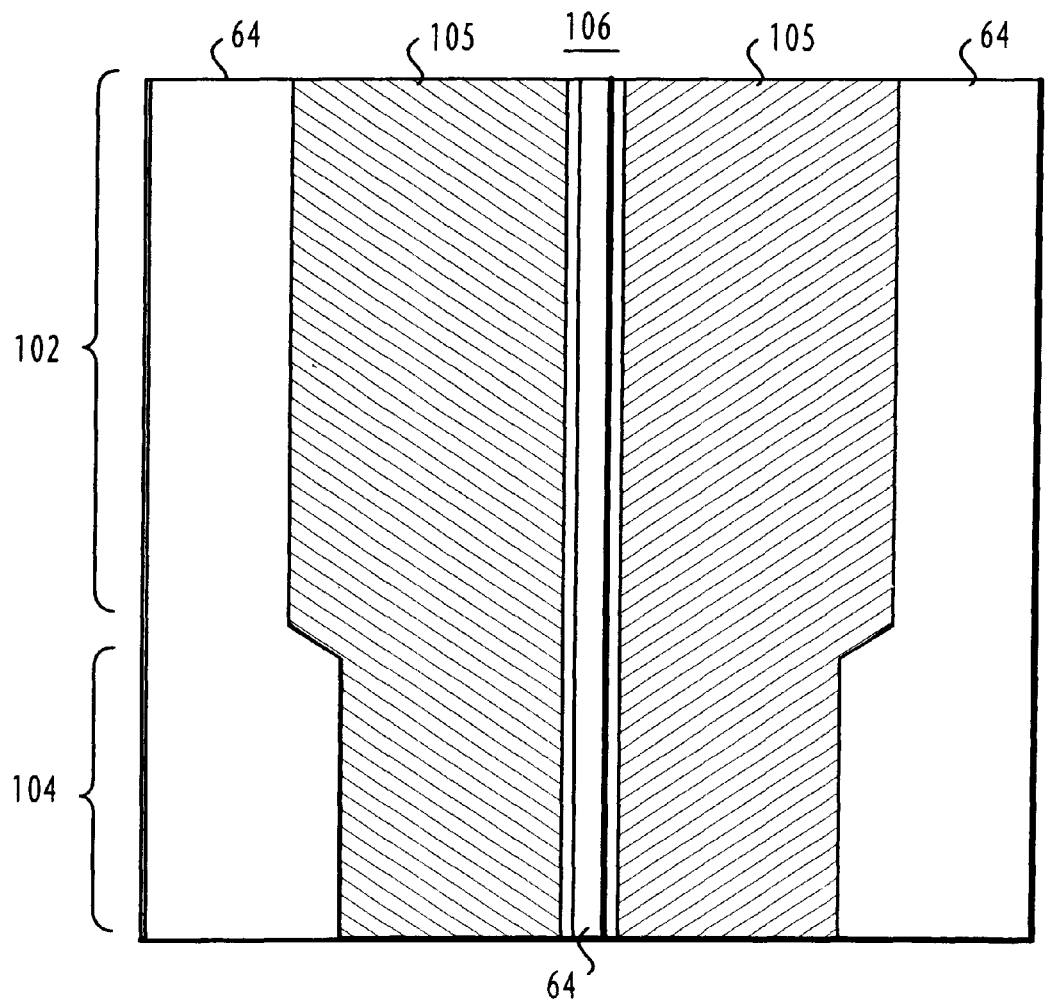
Figure 3B:
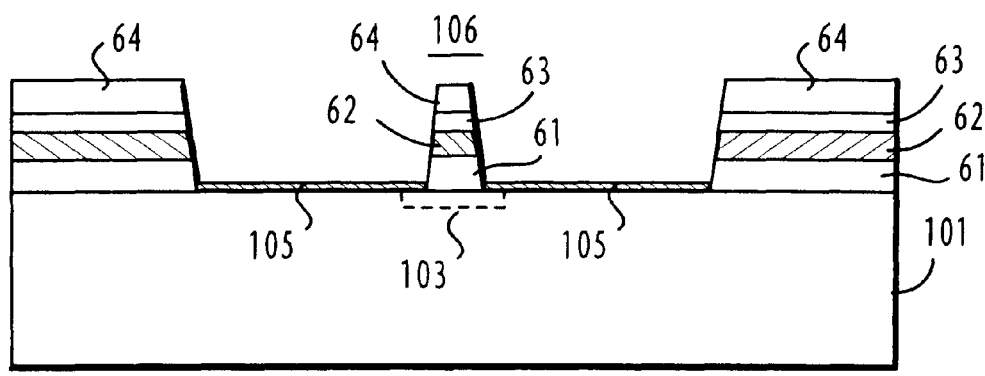

As shown in FIGS. 3A and 3B, a selective-area epitaxial process such as metal organic vapor phase epitaxy (MOVPE) is performed by subjecting the device in a reactive environment maintained at a pressure of 75 Torr and an elevated temperature of 625° C. to form a 0.1-μm thick InGaAsP guide layer 61 with a carrier concentration of $5 \times 10^{17}$ cm$^{-3}$ and a bandgap of 1.13 μm. An active layer 62 is then deposited. This active layer is a multiple-quantum-well (MQW) system consisting of 6-nm thick InGaAsP well layers with a bandgap of 1.56 μm in the laser section 102 and 1.47 μm in the modulator section 104. These well layers are alternately sandwiched between 8-nm thick barrier layers with a bandgap of 1.13 μm in the laser section 102 and 1.47 μm in the modulator section 104. On the active layer 62 is epitaxially grown a 60nm thick InGaAsp light confinement layer 63 with a carrier concentration of $5 \times 10^{17}$ cm$^{-3}$ and a bandgap of 1.13 μm. On the light confinement layer 63 is a 0.1-μm thick p-type InP cladding layer 64 having a carrier concentration of $5 \times 10^{17}$ cm$^{-3}$ and a bandgap of 1.13 μm. Thus, the epitaxial layers 61 to 64 are formed on the areas not covered with the masking films 105. The epitaxial layers 61 to 64 formed in the central region of the device constitute a light waveguide 106 that extends at constant width along the length of the device.

The inner edges of the masking films 105 are then etched so that they are separated a distance of 8 μm apart from each other, revealing portions of the principle surface of substrate 101 on the opposite sides of the light waveguide 106.

Figure 4A:
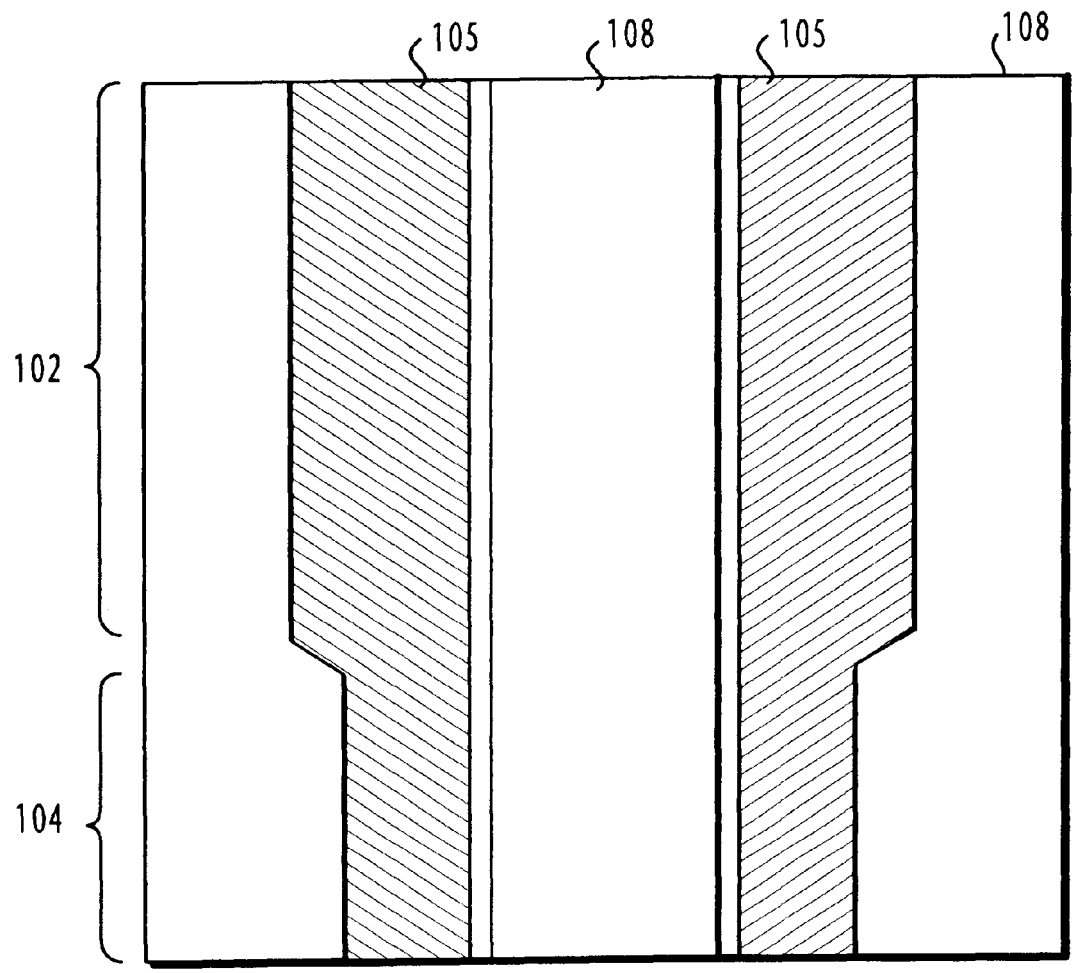
Figure 4B:
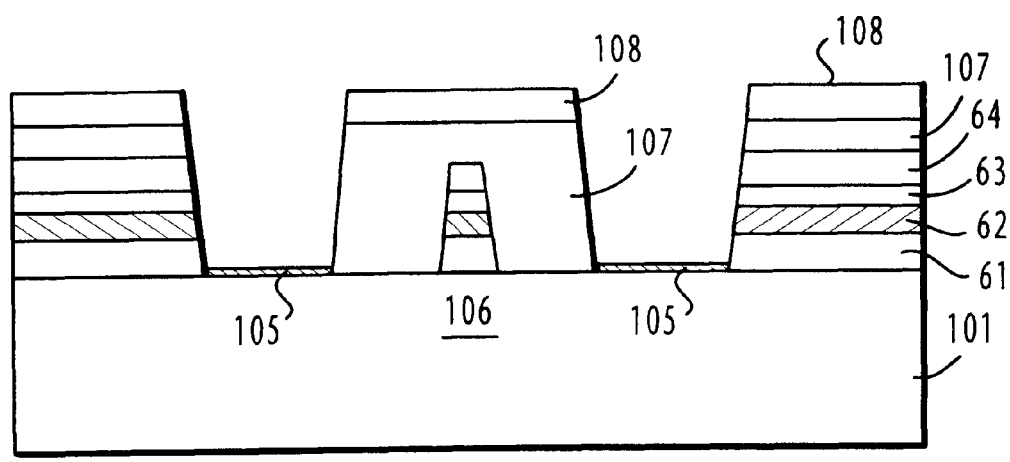

As shown in FIGS. 4A and 4B, a selective-area MOVPE process is then performed by subjecting the device in a reactive environment maintained at a pressure of 75 Torr and an elevated temperature of 625° C. to epitaxially grow a mesa type laminated embedding structure 107 consisting of a 0.3 μm thick p-type InP layer with a carrier concentration of $5 \times 10^{17}$ cm$^{-3}$ and a 1.5 μm thick p-type layer with a carrier concentration of $1 \times 10^{18}$ cm$^{-3}$. As a result, the light waveguide 106 is buried in the embedding structure 107. The upper surface of the mesa type structure 107 is covered with a 0.2 μm thick epitaxial InGaAs contact layer 108 with a carrier concentration of $5 \times 10^{18}$ cm$^{-3}$. Contact layer 108 has a constant width of preferably 5 μm or less along the length of the device.

Figure 5A:
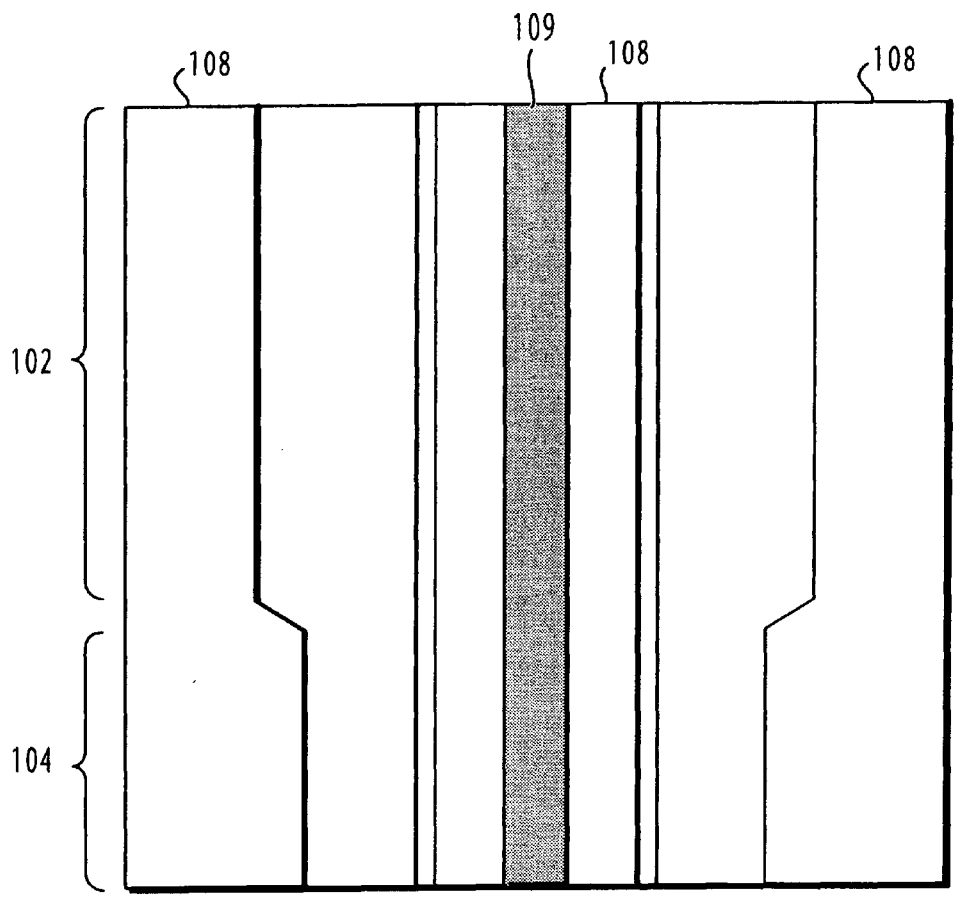
Figure 5B:
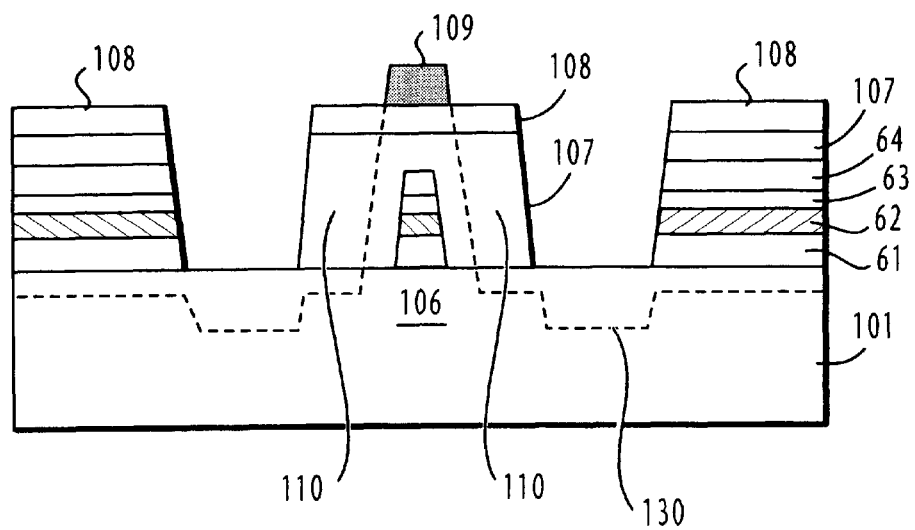

A photoresist stripe 109 is formed on the contact layer 108 using photolithography, as shown in FIGS. 5A and 5B. The width of this photoresist stripe is 2~3 μm which is wider than the width of light waveguide 106 embedded below the contact layer 108. The device is then subjected to a beam of protons accelerated at 200 kilovolts so that the device is injected with protons as indicated by a dotted line 130 to a dose of $1 \times 10^{15}$ cm$^{-2}$. As a result, a high resistance region 110 is produced in the embedding structure 107 on each side of the light waveguide 106. These high resistance regions have the effect of confining electrons in a narrow region surrounding the light waveguide 106.

Figure 6A:
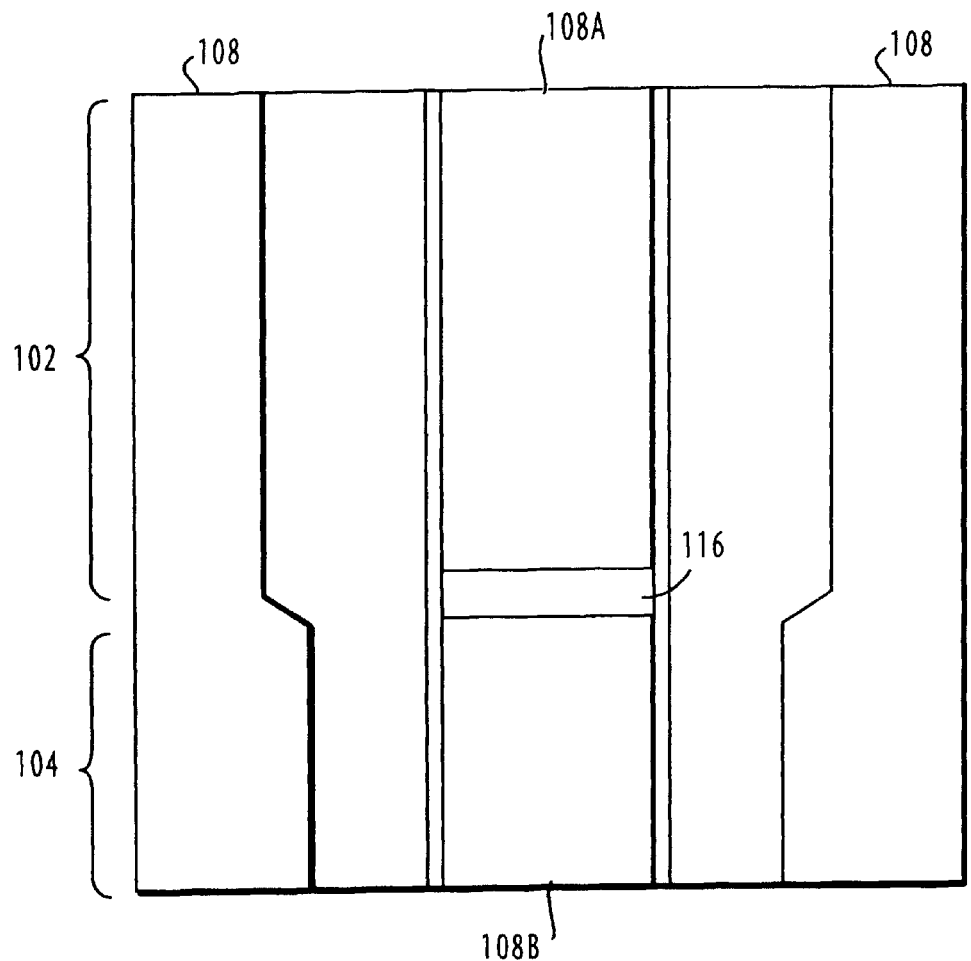
Figure 6B:
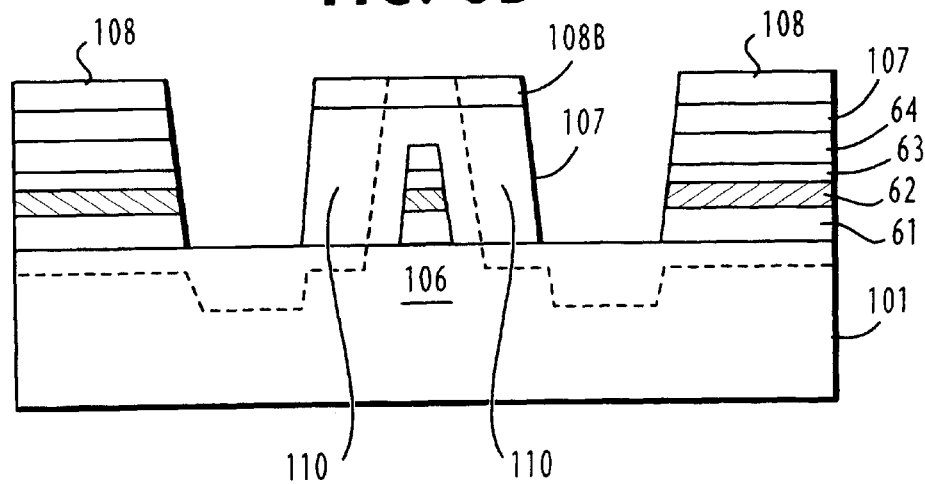

Photoresist mask 109 is removed as shown in FIGS. 6A, 6B to reveal the contact layer 108. The revealed contact layer 108 is then divided by a region 116 (with a separation of 25 to 50 μm) into two contact regions 108A and 108B respectively corresponding to the laser section 102 and the modulator section 104.

Figure 7A:
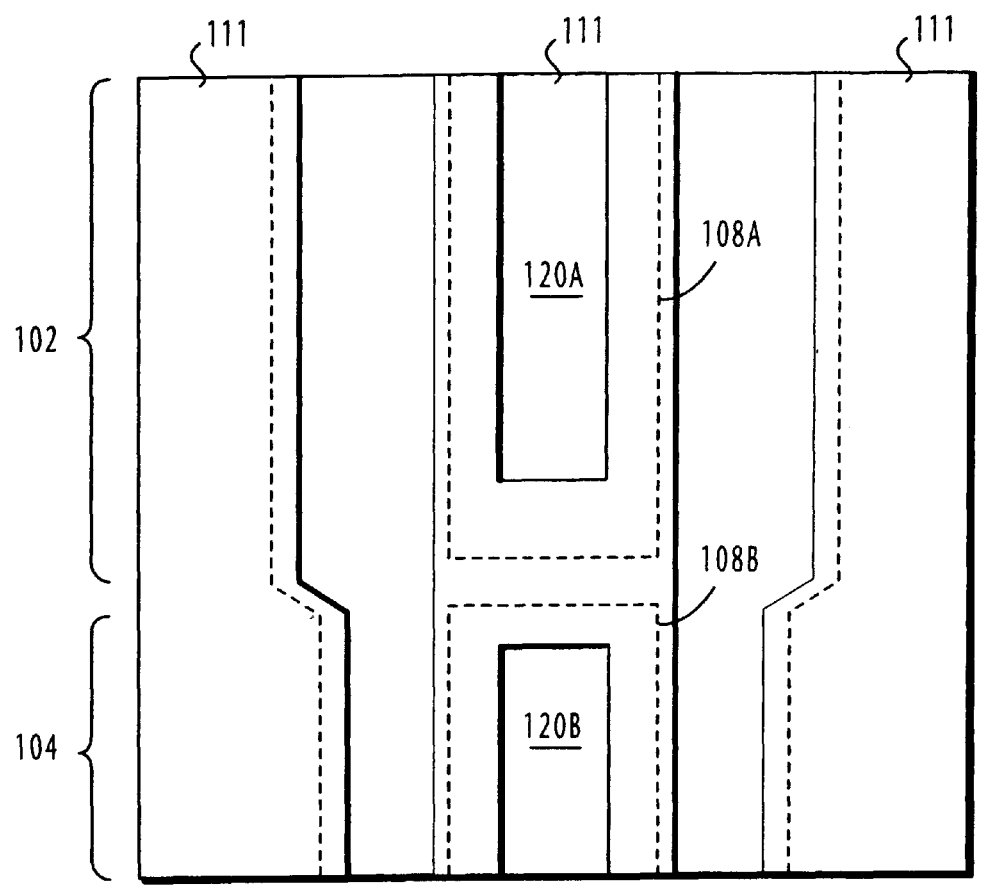
Figure 7B:
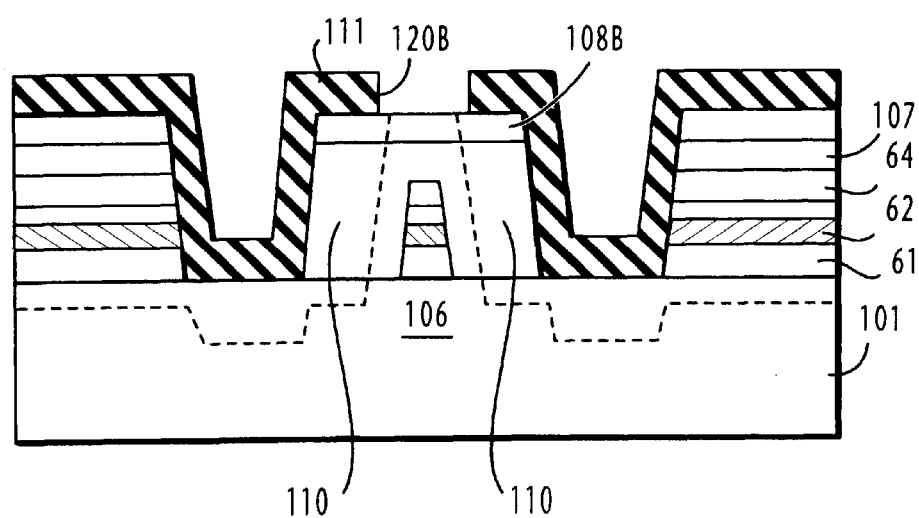

A silicon dioxide layer 111 is then deposited over the device to a thickness of 350 nm, as shown in FIGS. 7A ard 7B, by using the thermal CVD method, and then etched to form a rectangular contact window 120 on each of the laser and modulator sections 102 and 104 to reveal portions of the underlying contact layer 108, using photolithography and wet etching.

Figure 8A:
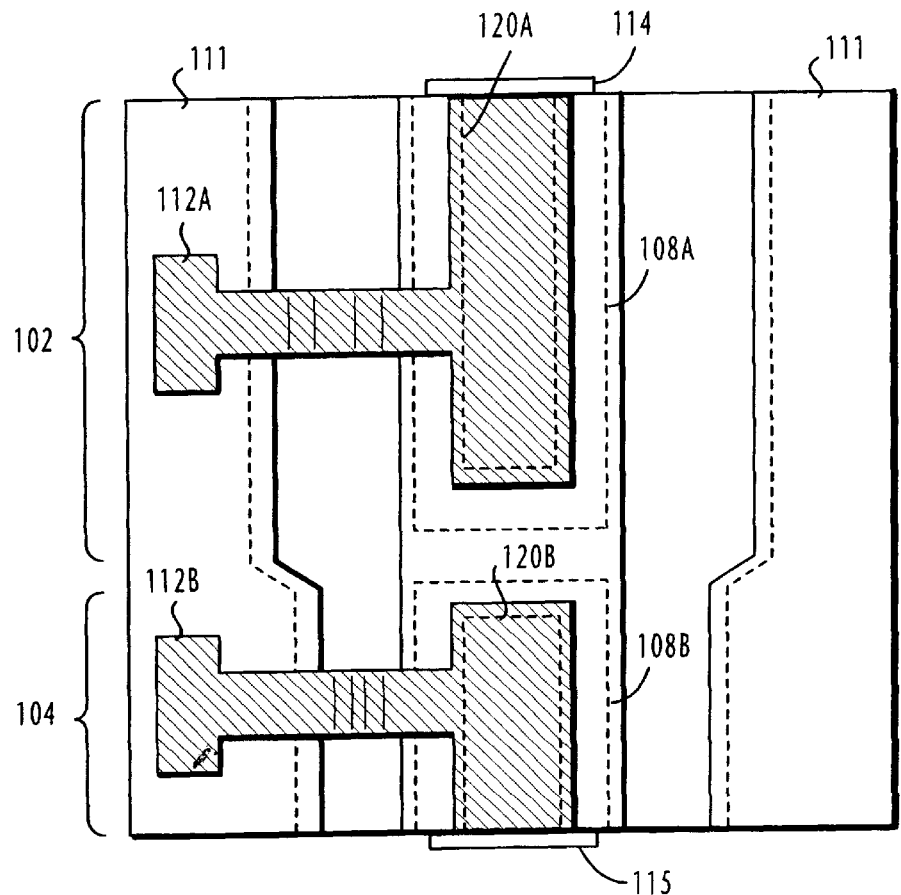
Figure 8B:
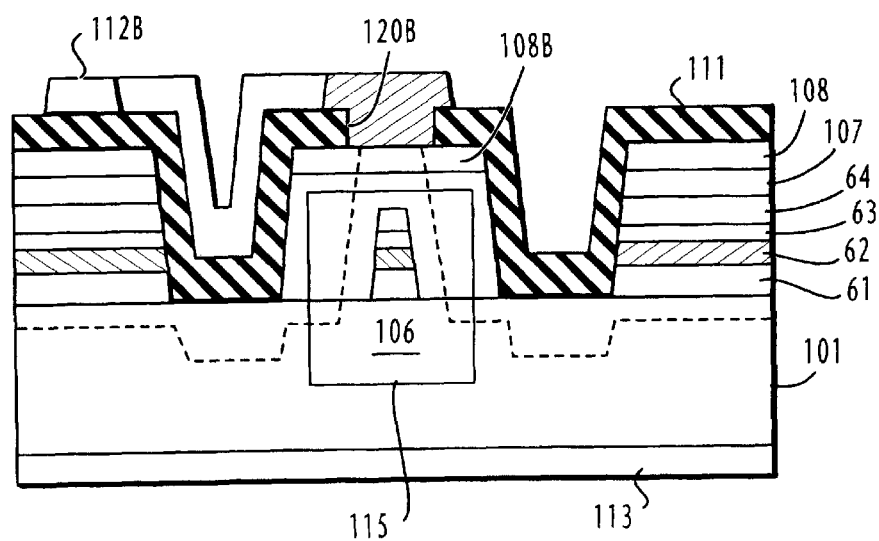
Figure 9A:
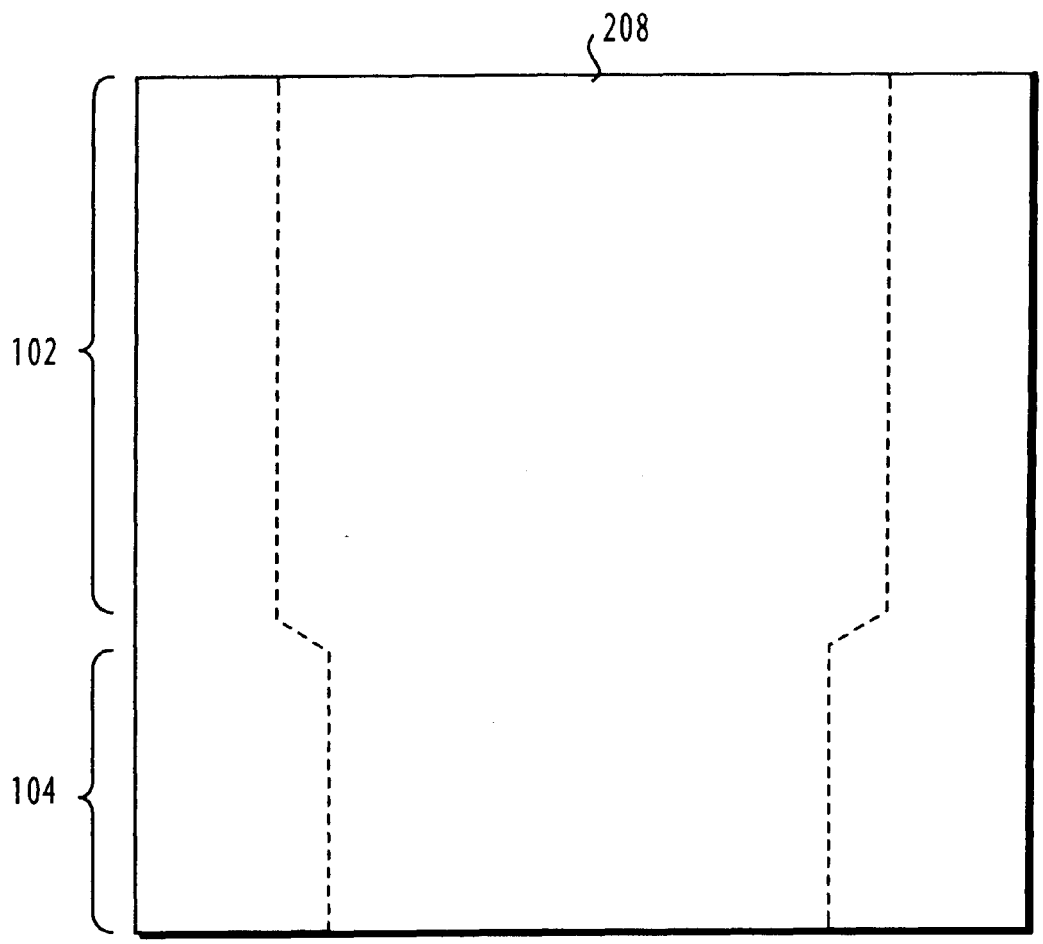
Figure 9B:
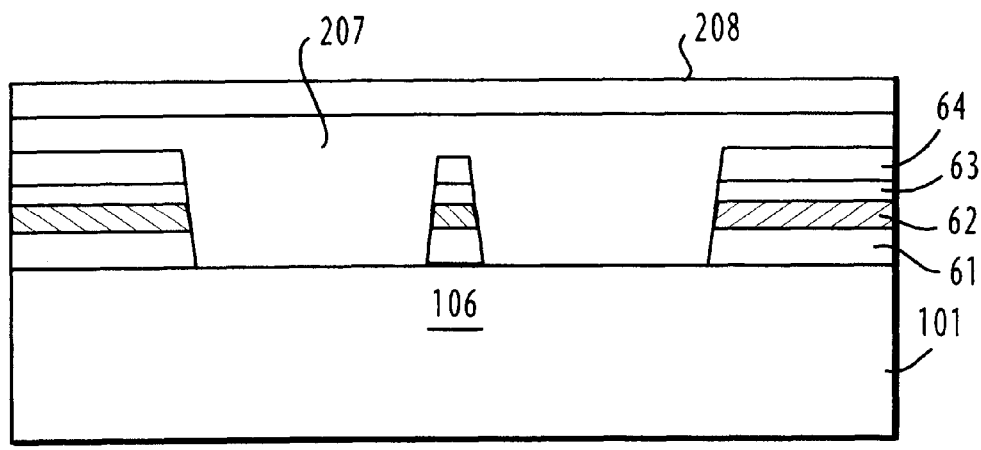

A metal layer of Ti/Au is deposited on each of the contact regions through each of the contact windows 120A, 120B to a thickness of 100 to 300 nm using a sputtering method and then patterned into positive electrodes 112A, 112B of pad structure, as shown in FIGS. 8A, 8B. The bottom surface of the substrate 101 is lapped and a negative Ti/Au electrode 113 is deposited on the bottom of each substrate. The negative electrode 113 has the same thickness as the positive electrode 112. The wafer is then cleaved to separate the individual devices. A reflecting film 114 of 90% reflectivity is attached to one end of the device near the laser section 102 and a reflective film 115 of 0.1% reflectivity is attached to the opposite end.

Since the width of contact regions 108A, 108B that extend over the light waveguide 109 is as small as 5 μm as described above and since these contact regions are not alterable to high resistive material when the device is subjected to proton injection, the capacitance of the device as measured between the high resistance regions 110 and the positive electrodes 112A, 112B can be significantly reduced in comparison with the prior art device.

Tests conducted on the laser manufactured according to the present invention indicate that the capacitance of the integrated modulator is 0.4 pF at a bias voltage of −1 volt and the cut-off frequency of the modulator for low level modulating signals is 15 GHz. When the laser was operated at a modulation rate of 10 Gb/s, the eye pattern of sufficiently clear opening was obtained. Further the extinction ratio of the device when the modulator is operated on a reverse bias voltage of 2 volts is more than 15 dB which is comparable to the value attainable with conventional lasers. Further, with an injection current of 100 mA, the laser delivered a 15 mW output.

FIGS. 9A, 9B to 11A, 11D show an alterative embodiment of the present invention which is similar to FIGS. 1A, 1B to 3A, 3B. With the laser device obtained as shown in FIGS. 3A, 3B, the masking films 105 are completely removed as opposed to the previous embodiment in which only side portions of the light waveguide 109 are removed.

With the masking films 105 being completely removed (FIGS, 9A, 9B), a selective-area MOVPE process is provided by subjecting the device in a reactive environment maintained at a pressure of 75 Torr and an elevated temperature of 625° C. to epitaxially grow a laminated embedding structure 207 consisting of p-type InP layer with a carrier concentration of $5 \times 10^{17}$ cm$^{-3}$ and a p-type InP layer with a carrier concentration of $1 \times 10^{18}$ cm$^{-3}$. Due to the absence of masking films, the embedding structure 207 covers the whole area of the device. The embedding structure 207 is then polished until it presents a flat upper surface. The upper surface of the embedding structure 207 is fully covered with a 0.2 μm thick epitaxial InGaAs contact layer 208 with a carrier concentration of $5 \times 10^{18}$ cm$^{-3}$.

Figure 10A:
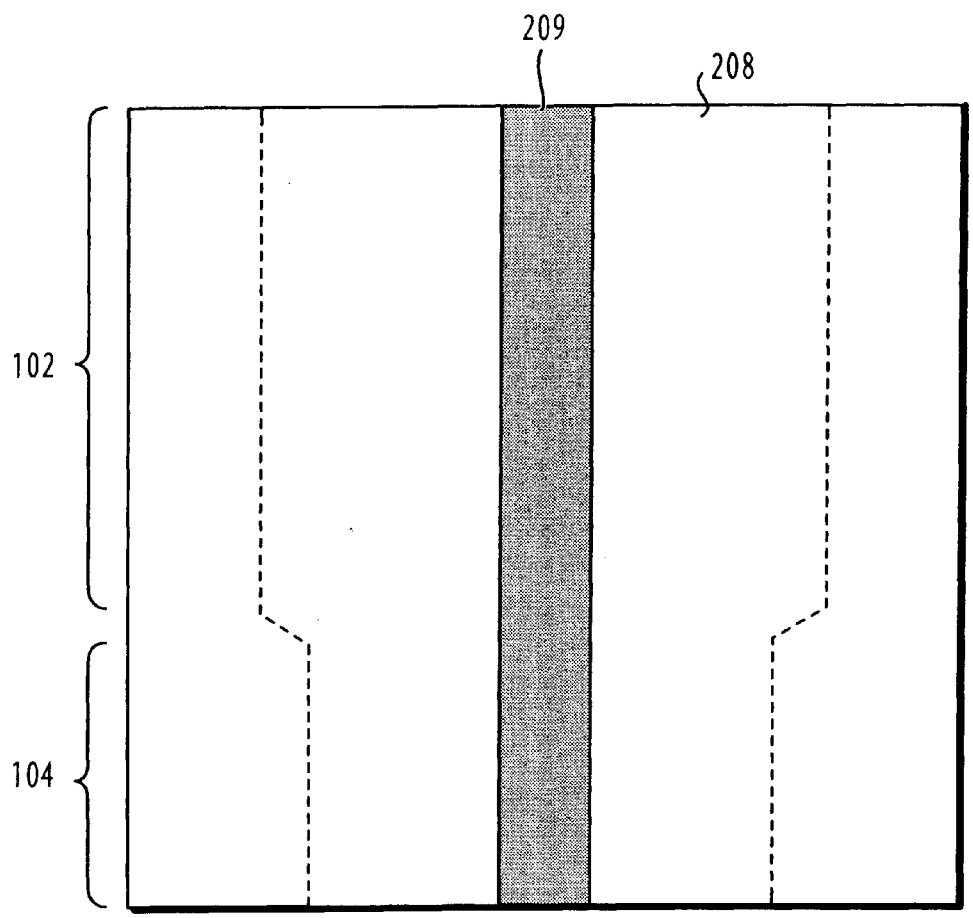
Figure 10B:
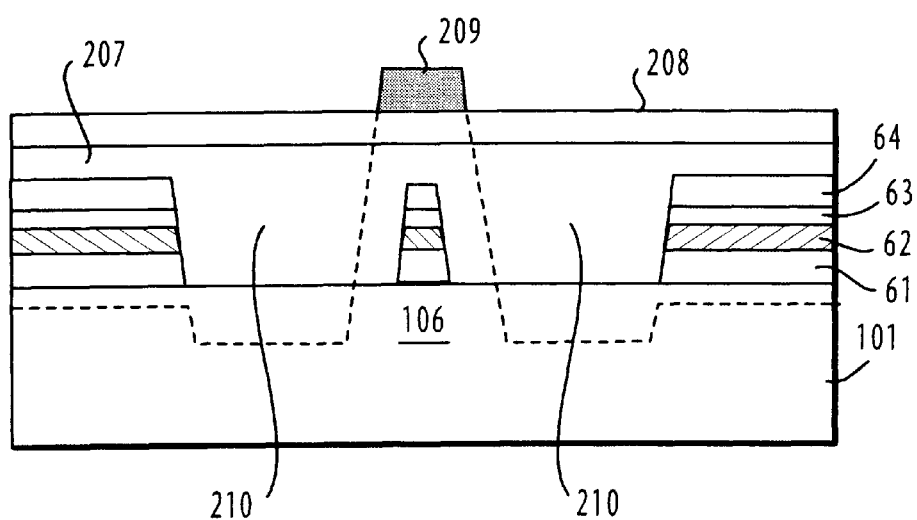

Using photolithography, a striped photoresist mask 209 with a width of 2 to 3 μm is formed on the contact layer 208 in a position immediately above the light waveguide 106, as shown in FIGS. 10A, 10B. The device is then subjected to a beam of protons accelerated at 200 kilovolts with a dose of $1 \times 10^{15}$ cm$^{-2}$ to produce a high resistance region 210 on each side of the light waveguide 106.

Photoresist mask 209 is then removed, followed by an etching process in which portions of the conductive layer 208 are removed such that it leaves a center portion of the layer 208 that lies above the light waveguide 106. Note that the width of this center portion of the layer 208 is about 5 μm which equals the width of contact layer 108 of the previous embodiment. With this etching process, the contact layer 208 is separated into two contact regions corresponding to the laser section 102 and the modulator section 104.

Figure 11A:
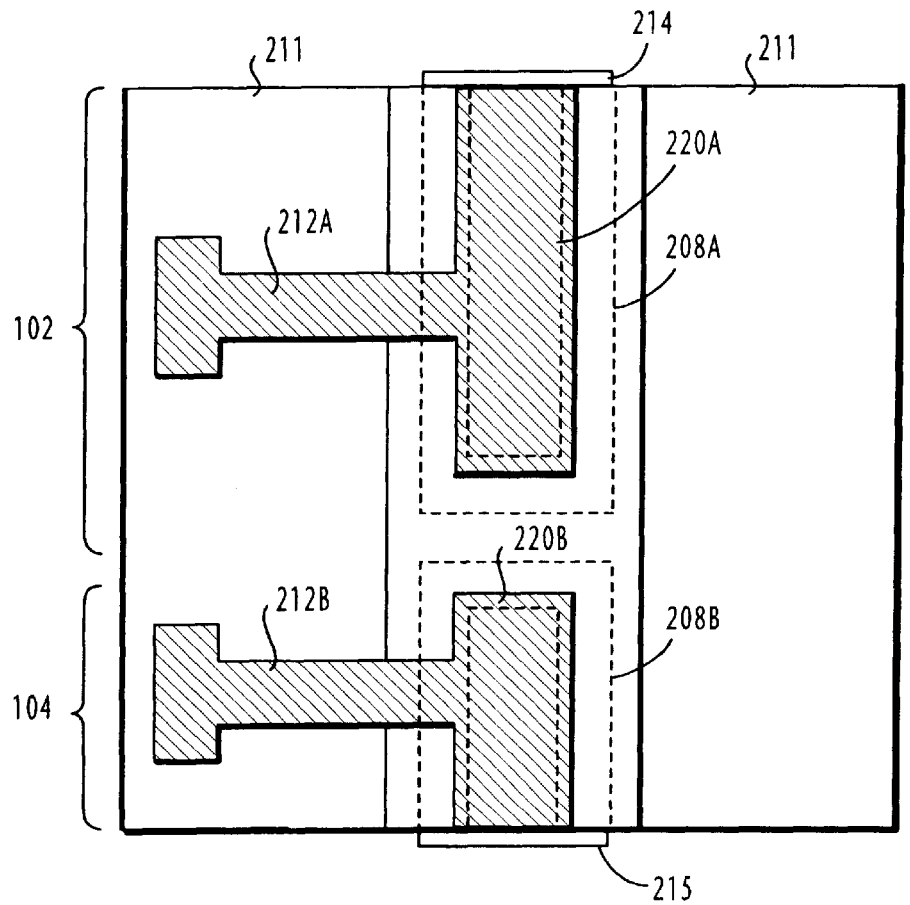
Figure 11B:
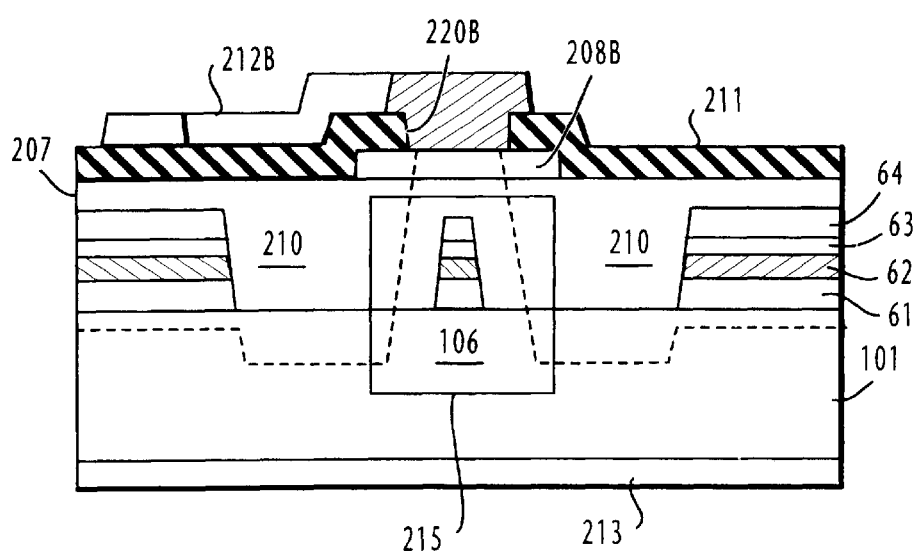

A silicon dioxide layer 211 is then deposited over the device to a thickness of 350 nm, as shown in FIGS. 11A, 11B and then etched to form a rectangular contact window on each of the laser and modulator sections 102 and 104 to reveal portions of the underlying contact layer 208. A metal layer of Ti/Au is deposited on each of the contact regions through each contact window to a thickness of 100 to 300 nm and then patterned into positive electrodes 212A, 212B of pad structure. As in the previous embodiment, the bottom surface of the wafer is lapped and a negative electrode 213 is deposited on the bottom of the substrate and the wafer is then cleaved to separate the individual devices. A reflecting film 214 of 90% reflectivity is attached to one end of the device near the laser section 102 and a reflective film 215 of 0.1% reflectivity is attached to the opposite end.

What is claimed is:

1. A semiconductor laser comprising:

a semiconductor substrate having a laser section and a modulator section;

a light waveguide having an active layer on said substrate and extending across said laser section and said modulator section from a high reflectivity end portion to a low reflectivity end portion;

an embedding structure for enclosing said light waveguide, said embedding structure covering a top surface of said waveguide and extending along side surfaces of said waveguide, the embedding structure having a pair of high resistance regions on each of said side surfaces of the light waveguide for confining electrons between said high resistance regions;

first and second elongated contact regions formed on said embedding structure corresponding respectively to said laser section and said modulator section;

an insulating layer for covering portions other than said first and second elongated contact regions; and first and second electrodes formed on said insulating layer for establishing ohmic contact with said first and second contact regions, respectively.

2. The semiconductor laser of claim 1, wherein each of said first and second elongated contact regions and said embedding structure have a substantially same width.

3. The semiconductor laser of claim 1, wherein said embedding structure is formed of InP and said high resistance regions are implanted with protons and said first and second elongated contact regions are formed of InGaAsP or InGaAs.

4. The semiconductor laser of claim 1, wherein the laser section of said substrate is formed with a diffraction grating and wherein a portion of said light waveguide is formed on said diffraction grating.

5. The semiconductor laser of claim 1, wherein said first and second contact regions have a width of 5 $\mu$m or less.

6. The semiconductor laser of claim 1, wherein said light waveguide further comprises a guide layer on which said active layer is formed, a light confinement layer on the active layer and a cladding layer on the light confinement layer.

7. A method of fabricating a semiconductor laser comprising the steps of:

forming a light waveguide having an active layer on a semiconductor substrate having a laser section and a modulator section, the light waveguide extending across said laser section and said modulator section from a high reflectivity end portion to a low reflectivity end portion;

forming an embedding structure for enclosing said light waveguide, said embedding structure covering a top surface of said waveguide and extending along side surfaces of said waveguide;

forming first and second elongated contact regions on said embedding structure corresponding respectively to said laser section and said modulator section and producing first and second high resistance regions in said embedding structure on opposite sides of the light waveguide so that electrons are confined between said first and second high resistance regions;

forming an insulating layer for covering portions of the semiconductor laser other than said first and second elongated contact regions; and forming first and second electrodes on said insulating layer for establishing ohmic contact with said first and second elongated contact regions, respectively.

8. The method of claim 7, wherein the step (c) comprises the steps of:

epitaxially growing an elongated contact layer on said embedding structure;

forming an elongated resist mask on said elongated contact layer above said embedded light waveguide;

implanting protons into said embedding structure so that said first and second high resistive portions are produced on opposite sides of said light waveguide;

removing said elongated resist mask; and separating said elongated contact layer into said first and second elongated contact region.

9. The method of claim 7, wherein the step (c) comprises the steps of:

epitaxially growing a contact layer on said embedding structure;

forming an elongated resist mask on said contact layer above said embedded light waveguide;

implanting protons into said embedding structure so that said first and second high resistive portions are produced on opposite sides of said light waveguide;

removing said elongated resist mask; and patterning said contact layer into said first and second elongated contact regions.

10. The method of claim 7, wherein each of said first and second elongated contact regions and said embedding structure have a substantially same width.

11. The method of claim 7, wherein said embedding structure is formed of InP and said first and second elongated contact regions are formed of InGaAsP or InGaAs.

12. The method of claim 7, wherein the step (a) comprises the step of forming a diffraction grating and forming said portion of said light waveguide on said diffraction grating.

13. The method of claim 7, wherein said first and second contact regions have a width of 5 $\mu$m or less.

14. The method of clam 7, wherein said light waveguide further comprises a guide layer on which said active layer is formed, a light confinement layer on the active layer and a cladding layer on the light confinement layer.

* * * * *